(12) United States Patent
Persson et al.

(10) Patent No.: US 8,055,212 B2
(45) Date of Patent: Nov. 8, 2011

(54) TRANSMITTER PHASE SHIFT DETERMINATION AND COMPENSATION

(75) Inventors: Jonas Persson, Furulund (SE); Ralf Burdenski, Nuremberg (DE); Ralf Dittrich, Nuremberg (DE)

(73) Assignee: ST-Erisson SA, Geneva (CH)

( * ) Notice: Subject to any disclaimer, the term of this patent is extended or adjusted under 35 U.S.C. 154(b) by 402 days.

(21) Appl. No.: 12/471,568

(22) Filed: May 26, 2009

(65) Prior Publication Data

US 2010/0304695 A1 Dec. 2, 2010

(51) Int. Cl.
*H04B 1/02* (2006.01)
(52) U.S. Cl. ....... 455/91; 455/103; 455/115.1; 455/126; 375/295; 375/303; 375/305; 375/308
(58) Field of Classification Search .................. 455/39, 455/91, 103, 115.1, 126; 375/295, 303, 305, 375/308
See application file for complete search history.

(56) References Cited

U.S. PATENT DOCUMENTS

| | | | |
|---|---|---|---|
| 3,900,823 A | 8/1975 | Sokal et al. | |
| 5,940,025 A * | 8/1999 | Koehnke et al. | 342/159 |
| 7,106,782 B2 | 9/2006 | Howard et al. | |
| 7,376,206 B1 | 5/2008 | Simic et al. | |
| 2004/0125894 A1 | 7/2004 | Nakamura et al. | |
| 2007/0229180 A1 | 10/2007 | Shimizu et al. | |
| 2008/0026709 A1* | 1/2008 | Liu et al. | 455/121 |
| 2010/0151886 A1* | 6/2010 | Swope et al. | 455/456.5 |

FOREIGN PATENT DOCUMENTS

| | | |
|---|---|---|
| EP | 0169321 A2 | 1/1986 |
| EP | 0441579 A1 | 8/1991 |
| GB | 2330023 A | 4/1999 |

* cited by examiner

*Primary Examiner* — Tuan Pham
(74) *Attorney, Agent, or Firm* — Coats & Bennett, P.L.L.C.

(57) ABSTRACT

A wireless communication transmitter is configured to determine transmitter phase shift, and correspondingly includes a derivation circuit, one or more slope polarity tracking circuits, and a phase shift computation circuit. The derivation circuit derives a reference signal from a signal input to the transmitter and a feedback signal from the transmit signal corresponding to that input signal. So derived, differences in the reference and feedback signals reveal the effect the transmitter has on the transmit signal. Accordingly, the transmitter focuses on differences in the polarities of the reference signal's slope and the feedback signal's slope to determine the effect the transmitter has on the phase of the transmit signal. That is, the slope polarity tracking circuits track the slope polarities of the reference and feedback signals, while the phase shift computation circuit computes the transmitter phase shift as a function of differences in those tracked slope polarities.

26 Claims, 7 Drawing Sheets

TRANSMITTER PHASE SHIFT DETERMINATION AND COMPENSATION

TECHNICAL FIELD

The present invention relates generally to communication transmitters and particularly to determining the amount of phase shift introduced by a transmitter.

BACKGROUND

A wireless communication transmitter conditions a signal for transmission over a channel, such as by converting that signal to one having an amplitude and frequency more suitable for transmission. The resulting transmit signal, however, may have a phase which is shifted relative to the signal input to the transmitter (e.g., due to a biasing change of, and/or a gain change of, and/or the non-linearity of, an amplifier or other circuit included in the transmit path). A transmitter may compensate for this undesired phase shift by applying the opposite rotation to the phase of the input signal.

Of course, the magnitude and direction of the phase shift fluctuates with changes in the characteristics of certain transmit path circuits. Changes in the gain of an amplifier, for example, may alter the magnitude and direction of the phase shift introduced by that amplifier. In this case, determining the phase shift introduced at any given time is particularly complicated in Code Division Multiple Access (CDMA) or Long Term Evolution (LTE) systems where such gain changes occur dynamically to maintain control over the transmit signal power.

Prior approaches to determining transmitter phase shift include the use of special test signals, which is undesirable in terms of live operation. Other approaches require undesirably complex trigonometric calculations or look-up tables, for determining which phase shift corresponds to a given operating condition.

SUMMARY

Methods and apparatus taught herein advantageously determine transmitter phase shift, introduced by one or more transmit path circuits, based on differences in tracked slope polarities of a reference signal and a feedback signal. In one embodiment, for example, a wireless communication transmitter includes a derivation circuit, one or more slope polarity tracking circuits, and a phase shift computation circuit.

The derivation circuit derives a reference signal from the transmitter's input signal, and derives a feedback signal from the transmitter's corresponding output signal. The slope polarity tracking circuits track the slope polarities of the reference and feedback signals, and the phase shift computation circuit computes the transmitter phase shift as a function of differences in those tracked slope polarities.

More particularly, the slope polarity tracking circuits track the slope polarity of the reference and feedback signals by evaluating the difference between successive samples thereof, and determining whether this difference is positive or negative. Provided with the tracked slope polarities computed from the same respective samples of the reference and feedback signals, the phase shift computation circuit determines whether or not such tracked slope polarities coincide with one another. Out of a given number of tracked slope polarities, the phase shift computation circuit advantageously recognizes that a larger percentage of slope polarity coincidence indicates a smaller phase shift between the reference and feedback signals. Conversely, a smaller percentage of slope polarity coincidence indicates a larger phase shift. Thus, the phase shift computation circuit calculates the magnitude of the phase shift based on this percentage.

To also determine the direction of phase shift, in one embodiment, the transmitter rotates the reference signal by a plurality of test angles and determines the magnitude and direction of the phase shift as that of the test angle resulting in the greatest percentage slope polarity coincidence. In another embodiment, the transmitter derives the reference and feedback signals each as a complex signal having a number of Cartesian components. In this case, the phase shift computation circuit determines the direction by evaluating the slope polarity of one component of the feedback signal at the rising edges of another component of the signals. One or more embodiments of the transmitter contemplated herein compensate the transmitter input signal based on the determined magnitude and direction of the transmitter phase shift.

Of course, the present invention is not limited to the above features and advantages. Indeed, those skilled in the art will recognize additional features and advantages upon reading the following detailed description, and upon viewing the accompanying drawings.

DETAILED DESCRIPTION

Figure 1:
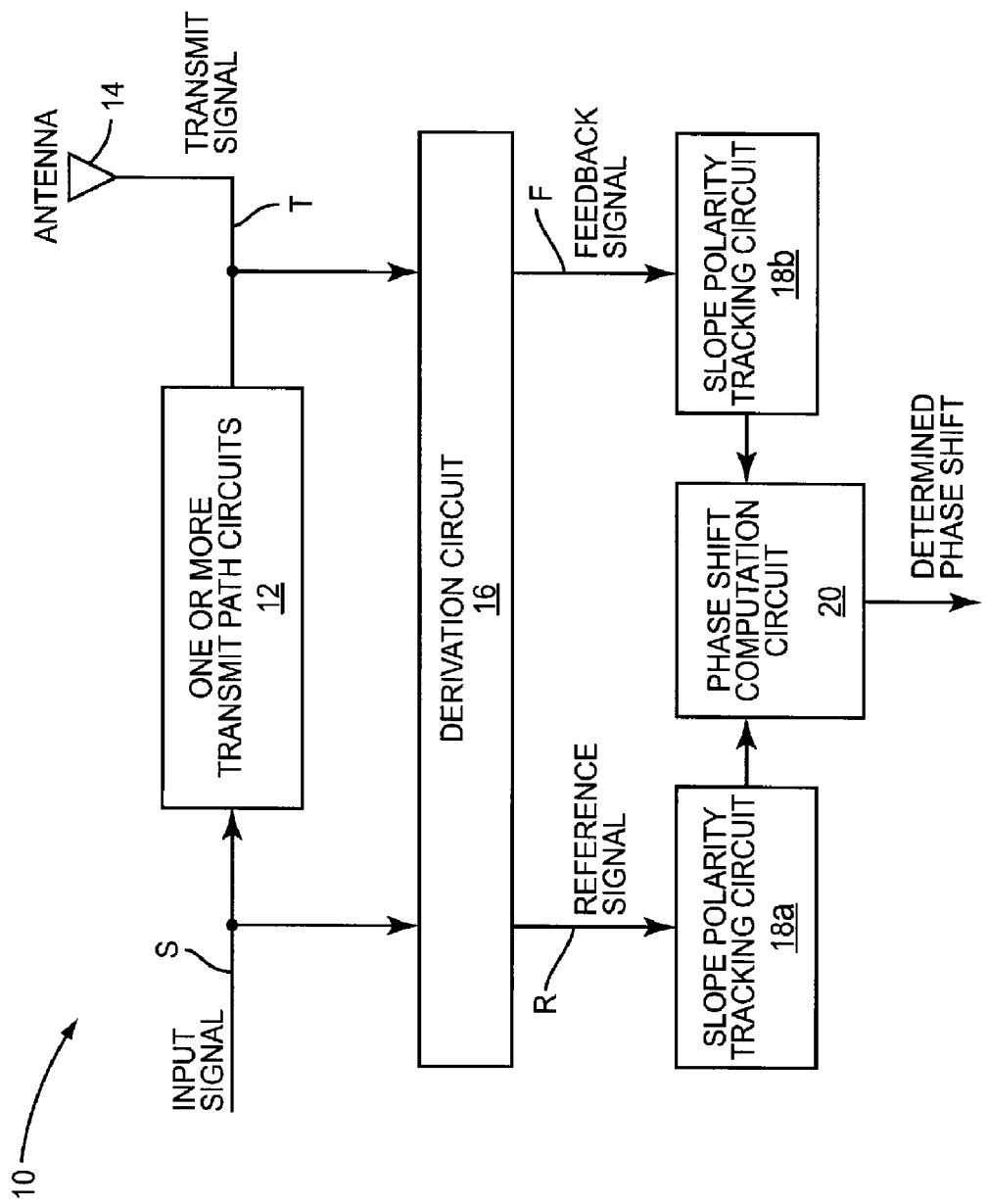
FIG. 1 is a block diagram illustrating a wireless communication transmitter according to one embodiment of the present invention.

FIG. 1 illustrates one embodiment of a wireless communication transmitter 10. The wireless communication transmitter 10 generally includes one or more transmit path circuits 12 and an antenna 14.

The transmit path circuits 12 are configured to convert an input signal S into a corresponding transmit signal T for transmission by the antenna 14. The transmit path circuits 12 may include, for example, various analog-to-digital converters, frequency up converters, filters, amplifiers, etc. In conditioning the input signal S for transmission, however, at least one of the transmit path circuits 12 shifts the phase of the corresponding transmit signal T relative to that of the input signal S. Configured to determine this phase shift, the wireless communication transmitter 10 further includes a derivation circuit 16, one or more slope polarity tracking circuits 18, and a phase shift computation circuit 20.

The derivation circuit 16 is configured to derive a reference signal R from the input signal S, and a feedback signal F from the corresponding transmit signal T. The reference signal R represents the input signal S before it is conditioned by the transmit path circuits 12. Likewise, the feedback signal F represents the corresponding transmit signal T, the result of the transmit path circuits 12 conditioning the input signal S. So derived, the transmitter 10 focuses on differences in the polarities of the reference signal's slope and the feedback signal's slope to determine the effect the transmit path circuits 12 have on the phase of the transmit signal T.

Figure 2:
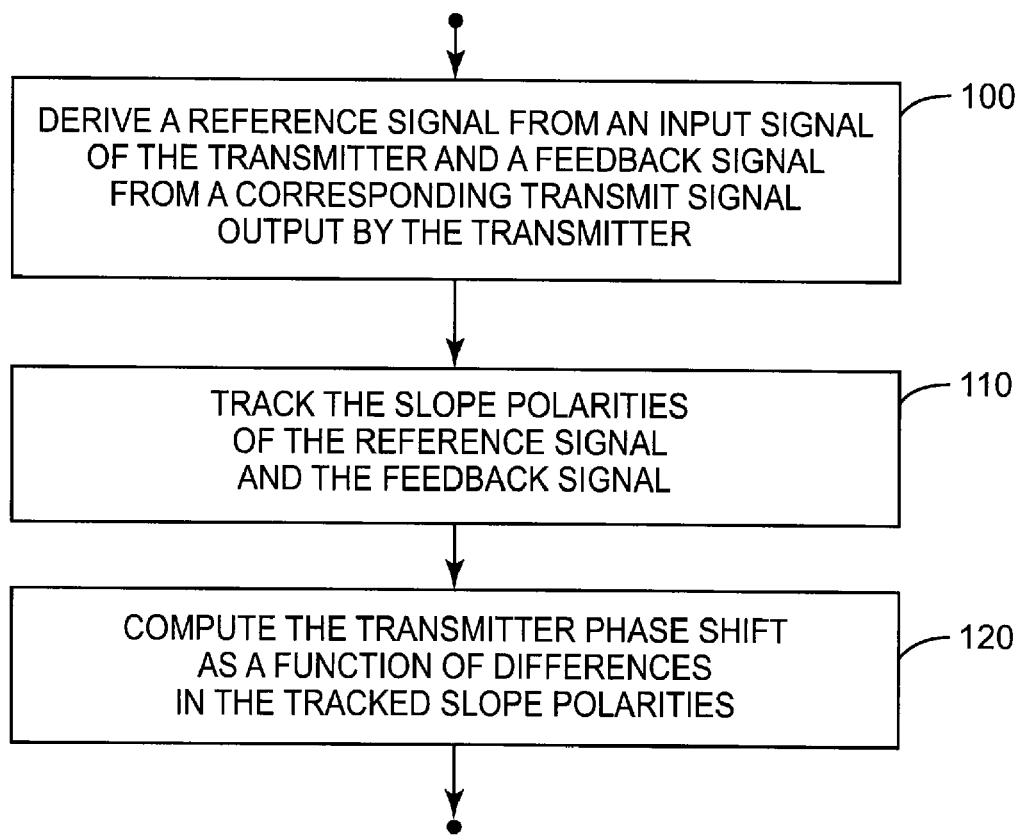
FIG. 2 is a logic flow diagram illustrating one embodiment of a method in the wireless communication transmitter of FIG. 1 for determining transmitter phase shift.

Functionally, therefore, the derivation circuit 16, the slope polarity tracking circuits 18a, 18b and the phase shift computation circuit 20 perform the steps illustrated in FIG. 2. That is, the derivation circuit 16 derives the reference signal R from the input signal S and the feedback signal F from the corresponding transmit signal T (Block 100). Given the reference and feedback signals, R, F, the slope polarity tracking circuits 18a, 18b track the slope polarities thereof (Block 110), and the phase shift computation circuit 20 computes the transmitter phase shift as a function of differences in those tracked slope polarities (Block 120).

Figure 3:
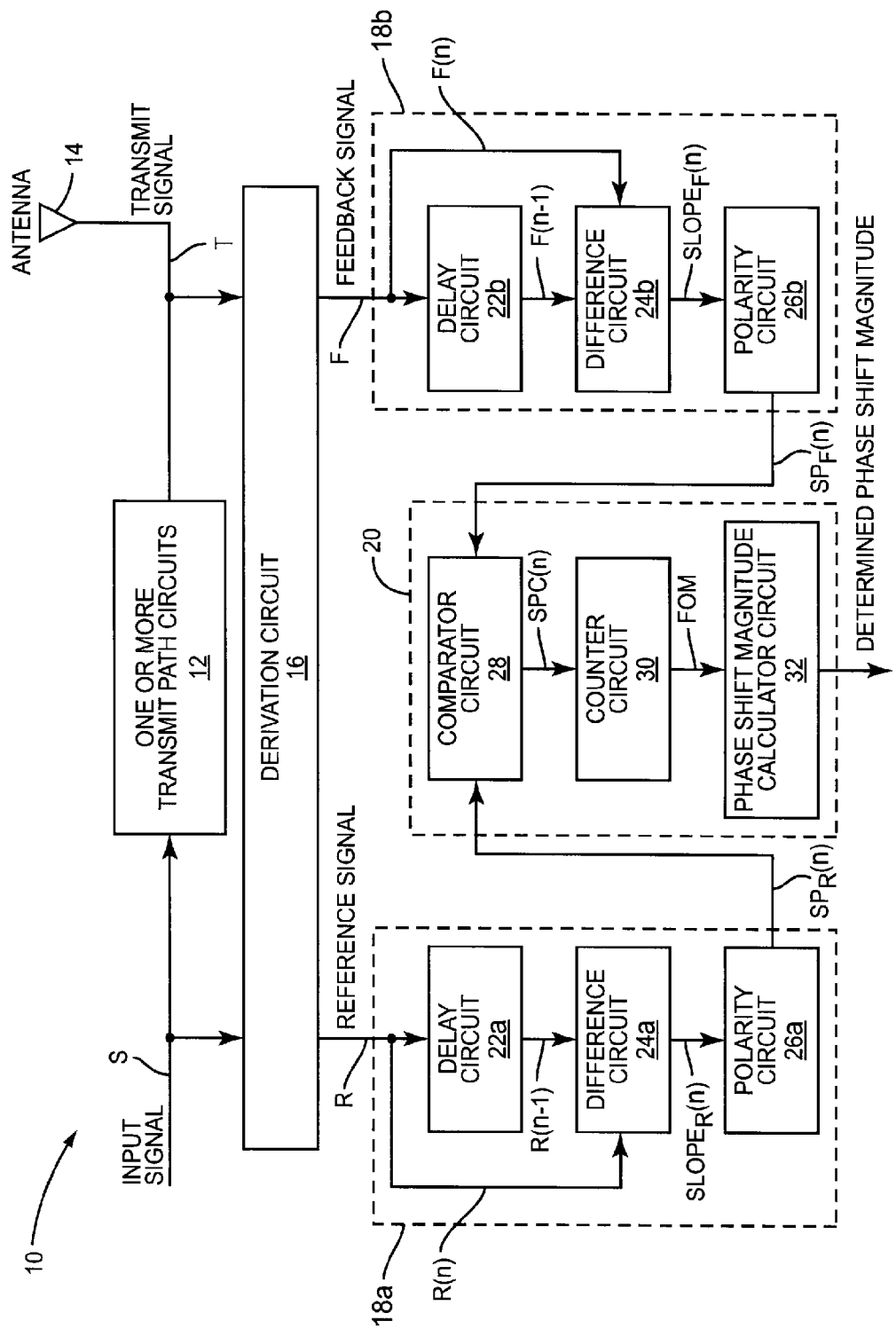
FIG. 3 is a block diagram illustrating one embodiment of the slope polarity tracking circuits and phase shift computation circuit for determining the magnitude of the transmitter phase shift.

FIG. 3 shows additional implementation details of the slope polarity tracking circuits 18a, 18b and the phase shift computation circuit 20 according to one embodiment. In FIG. 3, the slope polarity tracking circuits 18 each include a delay circuit 22, a difference circuit 24, and a polarity circuit 26. These circuits 22, 24, 26 track the slope polarity of a signal over a number of samples of that signal, by evaluating the difference between successive samples and determining whether this difference is positive or negative.

Specifically, the derivation circuit 16 derives the reference signal R as N samples of the input signal S, taken during N sampling intervals. As used herein, each of these samples is denoted by sample number n, where $0 \leq n \leq N-1$. Provided with the samples, the delay circuit 22a latches or delays each sample for one sampling interval. In sampling intervals after the first, therefore, the difference circuit 24a receives a sample for that interval, R(n), and also receives from the delay circuit 22a a sample for the previous interval, R(n−1). The difference circuit 24a evaluates the difference between these successive samples of the reference signal R as:

$$\text{Slope}_R(n) = R(n) - R(n-1) \quad (1)$$

This difference represents the slope of the reference signal over successive samples, R(n) and R(n−1). The polarity circuit 26a, provided with $\text{Slope}_R(n)$, determines the polarity of that slope (i.e., the Slope Polarity, SP):

$$SP_R(n) = \begin{cases} A, & \text{Slope}_R(n) \geq 0 \\ B, & \text{Slope}_R(n) < 0 \end{cases} \quad (2)$$

where A and B are defined in this embodiment as +1 for indicating a positive slope polarity and −1 for indicating a negative slope polarity. (As will become apparent from the description below, A and B have been defined as +1 and −1 merely for clarity of illustration. Indeed, in many embodiments, A and B may be defined arbitrarily so long as A≠B. In certain embodiments, however, A and B must be defined, or at least later converted into a form, so that A=−B. See, for example, embodiments utilizing equations 11 and 13).

The circuits 22a, 24a, and 26a operate as above for each pair of successive samples of the reference signal R. Accordingly, the circuits 22a, 24a, and 26a compute N−1 slope polarities of the reference signal R from N successive samples thereof, and provide each slope polarity to the phase shift computation circuit 20.

In a similar manner, the circuits 22b, 24b, and 26b compute N−1 slope polarities of the feedback signal F from N successive samples thereof, and provide each slope polarity to the phase shift computation circuit 20. The difference circuit 24b, for example, evaluates the difference between successive samples of the feedback signal F as:

$$\text{Slope}_F(n) = F(n) - F(n-1) \quad (3)$$

Likewise, the polarity circuit 26b determines the polarity of the feedback signal's slope over successive sampling intervals as:

$$SP_F(n) = \begin{cases} A, & \text{Slope}_F(n) \geq 0 \\ B, & \text{Slope}_F(n) < 0 \end{cases} \quad (4)$$

where A and B are defined consistent with their definition in equation (2) above, namely as +1 and −1. Having computed $SP_R(n)$ and $SP_F(n)$, therefore, the slope polarity tracking circuits 18a, 18b provide the slope polarities of the reference and feedback signals to the phase shift computation circuit 20.

The embodiment of FIG. 3 illustrates the phase shift computation circuit 20 implemented, at least in part, as a comparator circuit 28, a counter circuit 30, and a phase shift magnitude calculator circuit 32. The comparator circuit 28 compares tracked slope polarities computed from the same respective samples of the reference and feedback signals, namely $SP_R(n)$ and $SP_F(n)$. Based on this comparison, the comparator circuit 28 indicates whether or not such tracked slope polarities coincide with one another:

$$SPC(n) = \begin{cases} 1, & SP_R(n) = SP_F(n) \\ 0, & SP_R(n) \neq SP_F(n) \end{cases} \quad (5)$$

(Hence the above note that A and B may be defined arbitrarily so long as they are defined consistently for $SP_R(n)$ and $SP_F(n)$, and that A≠B). From equation (5), SPC(n) represents the Slope Polarity Coincidence (SPC) of the reference and feedback signals, determined based on the slope polarities computed from sample n. Of course, as mentioned above, the slope polarity tracking circuits 18a, 18b provide N−1 slope polarities to the phase shift computation circuit 20, and, therefore, the comparator circuit 28 makes N−1 comparisons of slope polarities.

The counter circuit 30, provided with SPC(n), counts the number of times the slope polarities of the reference and feedback signals coincide (i.e., the number of times SPC(n) =1 out of the N−1 slope polarities). Defining this number as a Figure of Merit (FOM) for determining transmitter phase shift, the counter circuit 30 computes:

$$FOM = \sum_{n=1}^{N-1} SPC(n) \quad (6)$$

As a corollary to equation (6), therefore, the percentage of slope polarities out of the N−1 slope polarities at which the slope polarities of the reference and feedback signals coincide amounts to:

$$\% \, SPC = \frac{FOM}{N-1} \qquad (7)$$

With this understanding, the phase shift magnitude calculator circuit 32 advantageously recognizes that a larger percentage of slope polarity coincidence, % SPC, indicates a smaller phase shift between the reference and feedback signals. Conversely, a smaller percentage of slope polarity coincidence, % SPC, indicates a larger phase shift between the reference and feedback signals. Thus, the phase shift magnitude calculator circuit 32 calculates the magnitude of the phase shift between the reference and feedback signals, $|\phi|$, as:

$$|\phi|=|180 \cdot (1-\% \, SPC)| \qquad (8)$$

From equation (8), the magnitude of the phase shift is 180 degrees when the slope polarities of the reference and feedback signals never coincide (i.e., when FOM=0). Conversely, the magnitude of the phase shift is 0 degrees when the slope polarities of the reference and feedback signals always coincide (i.e., when FOM=N-1).

As the reference and feedback signals were derived from the input and transmit signals, respectively, the phase shift magnitude calculator circuit's determination of the magnitude of the phase shift between the reference and feedback signals is likewise representative of that between the input and transmit signals. Yet the phase shift magnitude calculator circuit 32 as described above provides no indication as to the direction of this phase shift. To this end, FIG. 4 illustrates one embodiment of a transmitter 10 that further includes a reference signal rotation circuit 34 and a maximum coincidence determination circuit 36.

Figure 4:
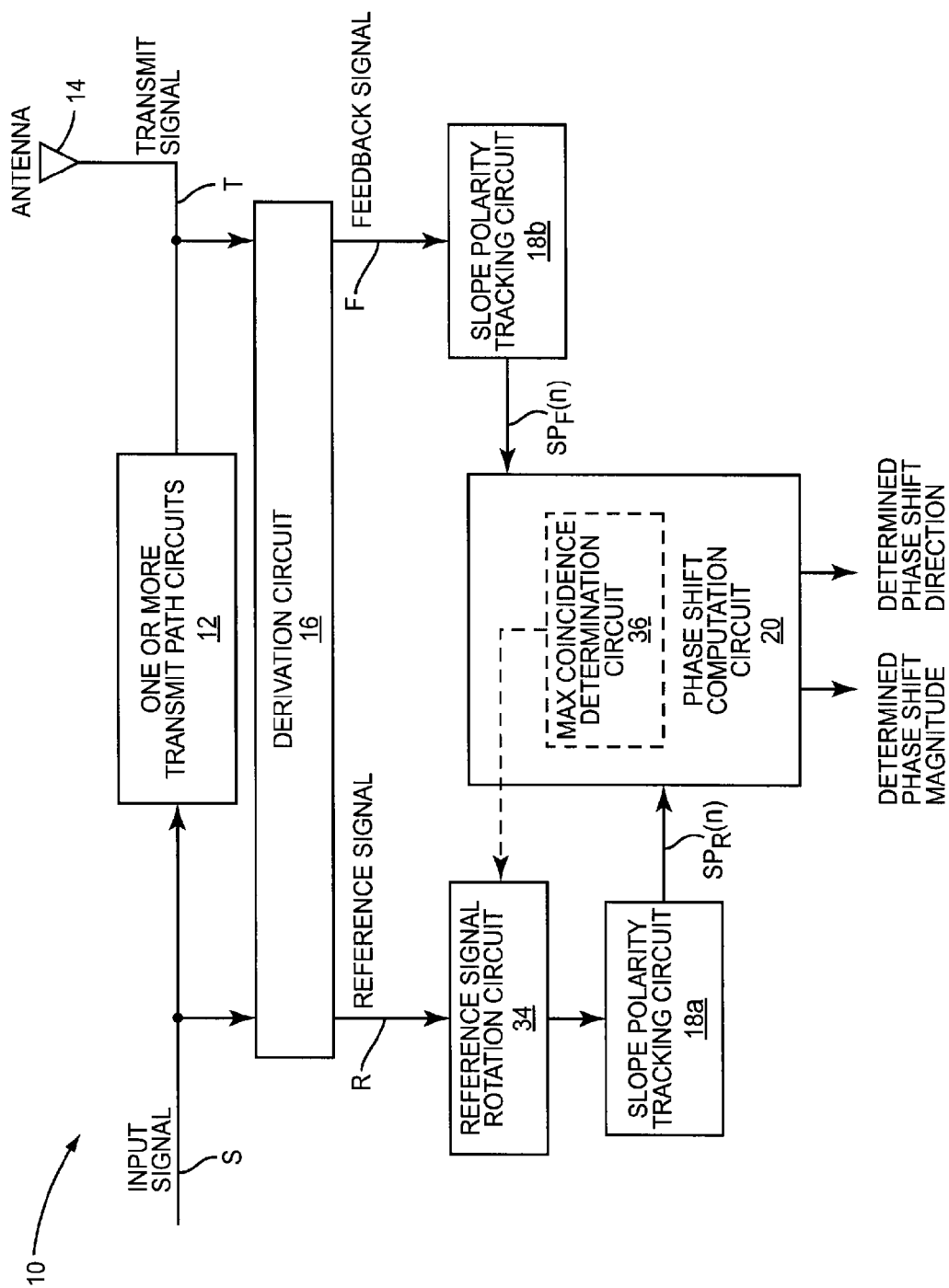
FIG. 4 is a block diagram illustrating one embodiment of the slope polarity tracking circuits and phase shift computation circuit for determining both the magnitude and direction of the transmitter phase shift.

In FIG. 4, the reference signal rotation circuit 34 shifts the phase of the reference signal by each one of a plurality of test angles. In one embodiment, for example, the test angles comprise a plurality of equally spaced angles between -180 degrees and +180 degrees (e.g., having a phase rotation granularity of $\Delta\theta°$). For each test angle, the slope polarity tracking circuit 18a tracks the slope polarity of the reference signal, as rotated by that test angle, and the phase shift computation circuit 20 computes the % SPC between the reference signal, again as rotated by that test angle, and the feedback signal. (These computations may be performed consistent with the above description of FIG. 3, albeit for different test angles).

Over the different test angles, the maximum coincidence determination circuit 36 keeps track of the test angle resulting in the maximum % SPC between the reference signal and the feedback signal. This test angle approximates the angle by which the un-rotated reference signal and the feedback signal differ. Accordingly, the phase shift computation circuit 20 determines the magnitude and direction of the transmitter phase shift as that of the test angle resulting in the maximum % SPC (i.e. the test angle resulting in the least difference between the tracked slope polarities of the reference and feedback signals).

Of course, those skilled in the art will readily appreciate that the degree to which such a test angle approximates the transmitter phase shift depends on the phase rotation granularity. That is, the larger the phase rotation granularity, the greater the error in the approximation. The smaller the phase rotation granularity, however, the more test angles for which the transmitter must compute the % SPC. Other embodiments of the present invention, therefore, contemplate use of an intelligent search algorithm (e.g., successive approximation) to narrow down the number of test angles for which the transmitter must compute the % SPC. In this case, instead of the range of angles between -180 degrees and +180 degrees comprising the test angles themselves, these angles merely represent a range of candidate angles. From this range of candidate angles, the phase shift computation circuit 20 uses an intelligent search algorithm to preemptively or incrementally select the test angles.

Figure 5:
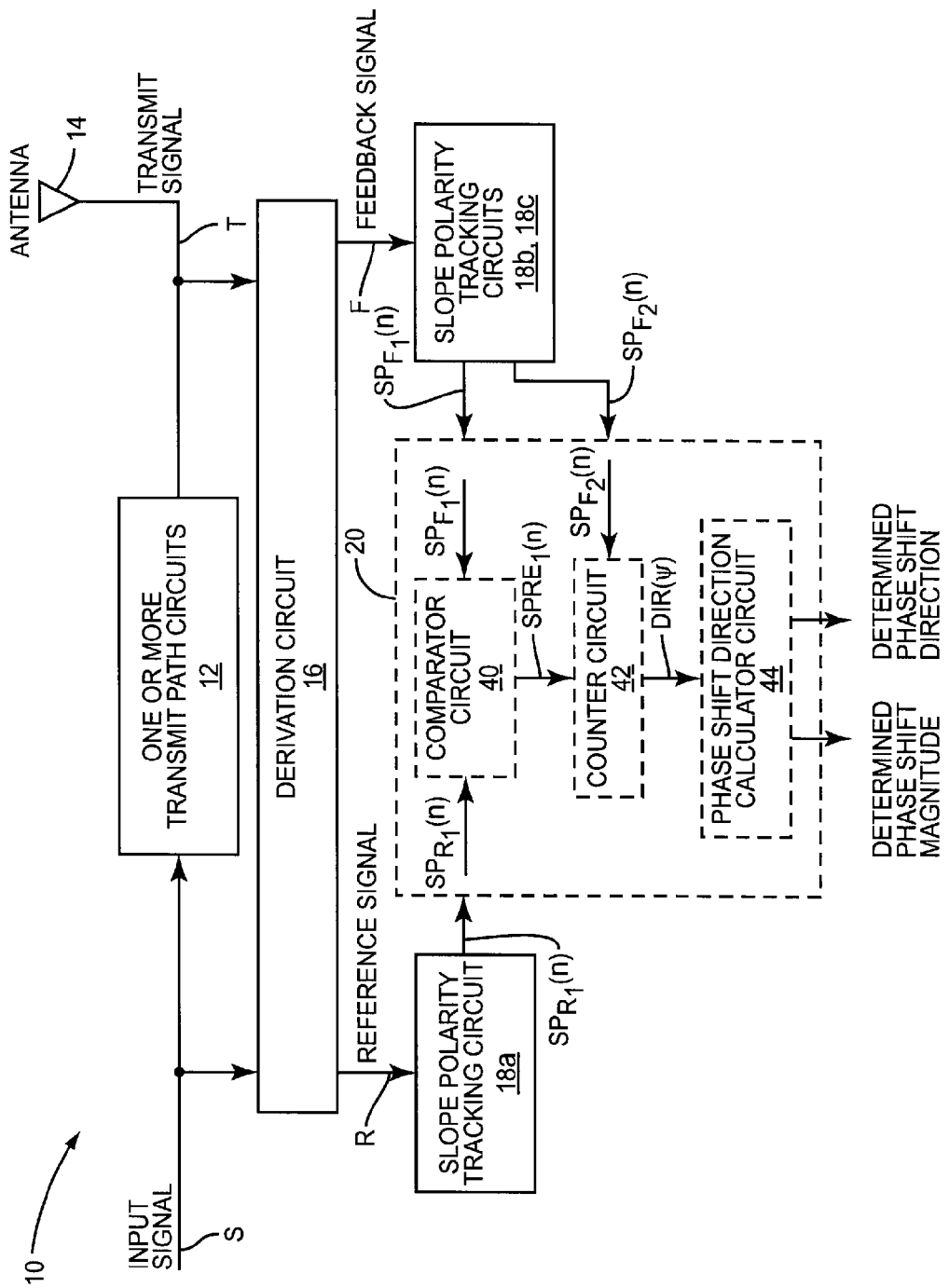
FIG. 5 is a block diagram illustrating an alternative embodiment of the slope polarity tracking circuits and phase shift computation circuit for determining both the magnitude and direction of the transmitter phase shift.

Nevertheless, as a faster alternative to computing the % SPC for any number of test angles, FIG. 5 illustrates another embodiment of the transmitter 10. In this embodiment, the derivation circuit 16 derives each of the reference and feedback signals as a complex signal having a number of Cartesian components (e.g., first and second Cartesian components). For example, the first and second Cartesian components are an inphase component and a quadrature component, respectively.

To determine the magnitude of the transmitter phase shift, the slope polarity tracking circuits 18a, 18b track the slope polarity of the same Cartesian component of the reference and feedback signals, respectively. In the embodiment of FIG. 5, for example, the slope polarity tracking circuit 18a tracks the slope polarity of the reference signal's first Cartesian component, $SP_{R_1}(n)$, while the slope polarity tracking circuit 18b likewise tracks the slope polarity of the feedback signal's first Cartesian component, $SP_{F_1}(n)$. Provided with these slope polarities, $SP_{R_1}(n)$ and $SP_{F_1}(n)$, the phase shift computation circuit 20 computes the SPC(n) as described above in equation (5), but based only on the slope polarity of each signal's first Cartesian component:

$$SPC(n) = \begin{Bmatrix} 1, & SP_{R_1}(n) = SP_{F_1}(n) \\ 0, & SP_{R_1}(n) \neq SP_{F_1}(n) \end{Bmatrix} \qquad (9)$$

Using the result of equation (9), the phase shift computation circuit 20 calculates the FOM, % SPC, and $|\phi|$ as described above in equations (6), (7), and (8) to thereby determine the magnitude of the transmitter phase shift.

To determine the direction of the transmitter phase shift, the transmitter 10 further includes a comparator circuit 40, a counter circuit 42, a phase shift direction computation circuit 44, and an additional slope polarity tracking circuit 18c. The comparator circuit 40 detects the rising edges (RE) of the slope polarity of each signal's first Cartesian component by comparing $SP_{R_1}(n)$ and $SP_{F_1}(n)$:

$$SPRE_1(n) = \begin{Bmatrix} 1, & SP_{R_1}(n) > SP_{F_1}(n) \\ 0, & SP_{R_1}(n) \leq SP_{F_1}(n) \end{Bmatrix} \qquad (10)$$

According to equation (10), $SPRE_1(n)=1$ indicates samples where the slope polarity of the reference signal's first Cartesian component is increasing while the slope polarity of the feedback signal's first Cartesian component is still decreasing. As these samples occur next to the extremum (i.e., the minimum or maximum) of each signal's first Cartesian component, $SPRE_1(n)$ indicates whether the reference or feedback signal changes direction earlier in time. Accordingly, the transmitter 10 calculates the direction of the phase shift by correlating $SPRE_1(n)$ with any of the Cartesian components of either the reference of feedback signal.

The counter circuit 42, for example, correlates $SPRE_1(n)$ with the slope polarity of the feedback signal's second Cartesian component, $SP_{F_2}(n)$, which is tracked by the additional slope polarity tracking circuit 18*c*. In doing so, the counter circuit 42 evaluates $SP_{F_2}(n)$ for samples where $SPRE_1(n)=1$ and accumulates such evaluations over all samples:

$$DIR(\varphi) = \sum_{n=1}^{N-1} SP_{F_2}(n) \cdot SPRE_1(n) \tag{11}$$

In the embodiment where $SP_{F_2}(n)$ evaluates to +1 when the slope polarity of the feedback signal's second Cartesian component is positive, and to −1 when that slope polarity is negative, the sign of $DIR(\phi)$ indicates the sign of the transmitter phase shift. (Hence the above note that A and B may be defined arbitrarily so long as they are defined, or at least later converted into a form, so that A=−B). Accordingly, the phase shift direction computation circuit 44 determines the direction of the phase shift as the sign of $DIR(\phi)$.

Of course, those skilled in the art will readily appreciate that FIG. 5 merely illustrates one embodiment of the transmitter 10. For example, the present invention is not limited to using the first and second Cartesian components in the exact manner as described above. In fact, rather than correlating the rising edges of the slope polarity of each signal's first Cartesian component with the slope polarity of the feedback signal's second Cartesian component, the transmitter 10 may correlate the rising edges of the slope polarity of each signal's second Cartesian component with the slope polarity of the feedback signal's first Cartesian component. That is, the phase shift computation circuit 20 may compute the direction of the transmitter phase shift according to equations (12) and (13) below, instead of equations (10) and (11):

$$SPRE_2(n) = \begin{cases} 1, & SP_{R_2}(n) > SP_{F_2}(n) \\ 0, & SP_{R_2}(n) \le SP_{F_2}(n) \end{cases} \tag{12}$$

$$DIR(\varphi) = \sum_{n=1}^{N-1} SP_{F_1}(n) \cdot SPRE_2(n) \tag{13}$$

In this case, the slope polarity tracking circuit 18*a* tracks the slope polarity of the reference signal's second Cartesian component, alternatively or in addition to tracking that of the reference signal's first Cartesian component.

Those skilled in the art will also appreciate that the present invention is not limited to using the rising edges, and, instead, may use the falling edges (FE) as shown below:

$$SPFE_1(n) = \begin{cases} 1, & SP_{R_1}(n) < SP_{F_1}(n) \\ 0, & SP_{R_1}(n) \ge SP_{F_1}(n) \end{cases} \tag{14}$$

In this case, the direction of the phase change may be calculated in a way similar to that with respect to the rising edges, except for adjustments to the sign of $DIR(\phi)$ (at least assuming that A and B are defined as +1 and −1 in the same way as well).

$$DIR(\varphi) = -\sum_{n=1}^{N-1} SP_{F_2}(n) \cdot SPFE_1(n) \tag{15}$$

An alternative formulation for the $2^{nd}$ Cartesian component is applicable as well:

$$SPFE_2(n) = \begin{cases} 1, & SP_{R_2}(n) < SP_{F_2}(n) \\ 0, & SP_{R_2}(n) \ge SP_{F_2}(n) \end{cases} \tag{16}$$

$$DIR(\varphi) = -\sum_{n=1}^{N-1} SP_{F_1}(n) \cdot SPFE_2(n) \tag{17}$$

Still further, the above description correlated the rising or falling edges of the slope polarities with the slope polarity of the feedback signal ($SP_{F_1}(n)$ or $SP_{F_2}(n)$). The present invention, however, also contemplates that the rising or falling edge of the slope polarities may be correlated with the slope polarity of the reference signal:

$$DIR(\varphi) = \sum_{n=1}^{N-1} SP_{R_2}(n) \cdot SPRE_1(n) \tag{18}$$

$$DIR(\varphi) = -\sum_{n=1}^{N-1} SP_{R_2}(n) \cdot SPFE_1(n) \tag{19}$$

$$DIR(\varphi) = \sum_{n=1}^{N-1} SP_{R_1}(n) \cdot SPRE_2(n) \tag{20}$$

$$DIR(\varphi) = -\sum_{n=1}^{N-1} SP_{R_1}(n) \cdot SPFE_2(n) \tag{21}$$

In various embodiments described above, those skilled in the art will appreciate the modifications needed in FIG. 5 to produce the values used. Rather than tracking the slope polarity of the feedback signal's second Cartesian component $SP_{F_2}(n)$, for example, the slope polarity tracking circuit 18*c* in one embodiment instead tracks the slope polarity of the reference signal's second Cartesian component, $SP_{R_2}(n)$.

The present invention is also not limited to exclusive use of the first Cartesian components for determining the magnitude of the transmitter phase shift. Rather, other embodiments may exclusively use the second Cartesian components for such determination. In this case, the phase shift computation circuit 20 computes the SPC(n) according to equation (14) below, instead of equation (9):

$$SPC(n) = \begin{cases} 1, & SP_{R_2}(n) = SP_{F_2}(n) \\ 0, & SP_{R_2}(n) \ne SP_{F_2}(n) \end{cases} \tag{14}$$

Still other embodiments may use both the first and second Cartesian components for determining the magnitude of the phase shift. To explain, the phase shift computation circuit 20 may determine the phase shift over one or more determination intervals (i.e., based on one or more sets of N samples for the reference and feedback signals). With this understanding, the phase shift computation circuit 20 may use both the first and second Cartesian components in each determination interval, or use the first and second Cartesian components in alternating intervals. That is, in the former case, the phase shift computation circuit 20 computes the SPC(n) using the first Cartesian components (i.e., according to equation (9)), and, in the same determination interval, separately computes the SPC(n) using the second Cartesian components (i.e., according to equation (14)). In this case, the phase shift computation circuit 20, determines the magnitude of the transmitter phase shift based on a parallel analysis of the first and second Cartesian components.

In the latter case, the phase shift computation circuit 20 computes the SPC(n) using the first Cartesian components in some determination intervals, and, in other determination intervals, computes the SPC(n) using the second Cartesian components. In this case, the phase shift computation circuit 20, may determine the magnitude of the transmitter phase shift based on an alternating analysis of the first and second Cartesian components:

$$SPC(n) = \begin{cases} \text{For even } n: 1, & SP_{R_1}(n) = SP_{F_1}(n) \\ 0, & SP_{R_1}(n) \neq SP_{F_1}(n) \\ \text{For odd } n: 1, & SP_{R_2}(n) = SP_{F_2}(n) \\ 0, & SP_{R_2}(n) \neq SP_{F_2}(n) \end{cases} \quad (15)$$

Figure 6:
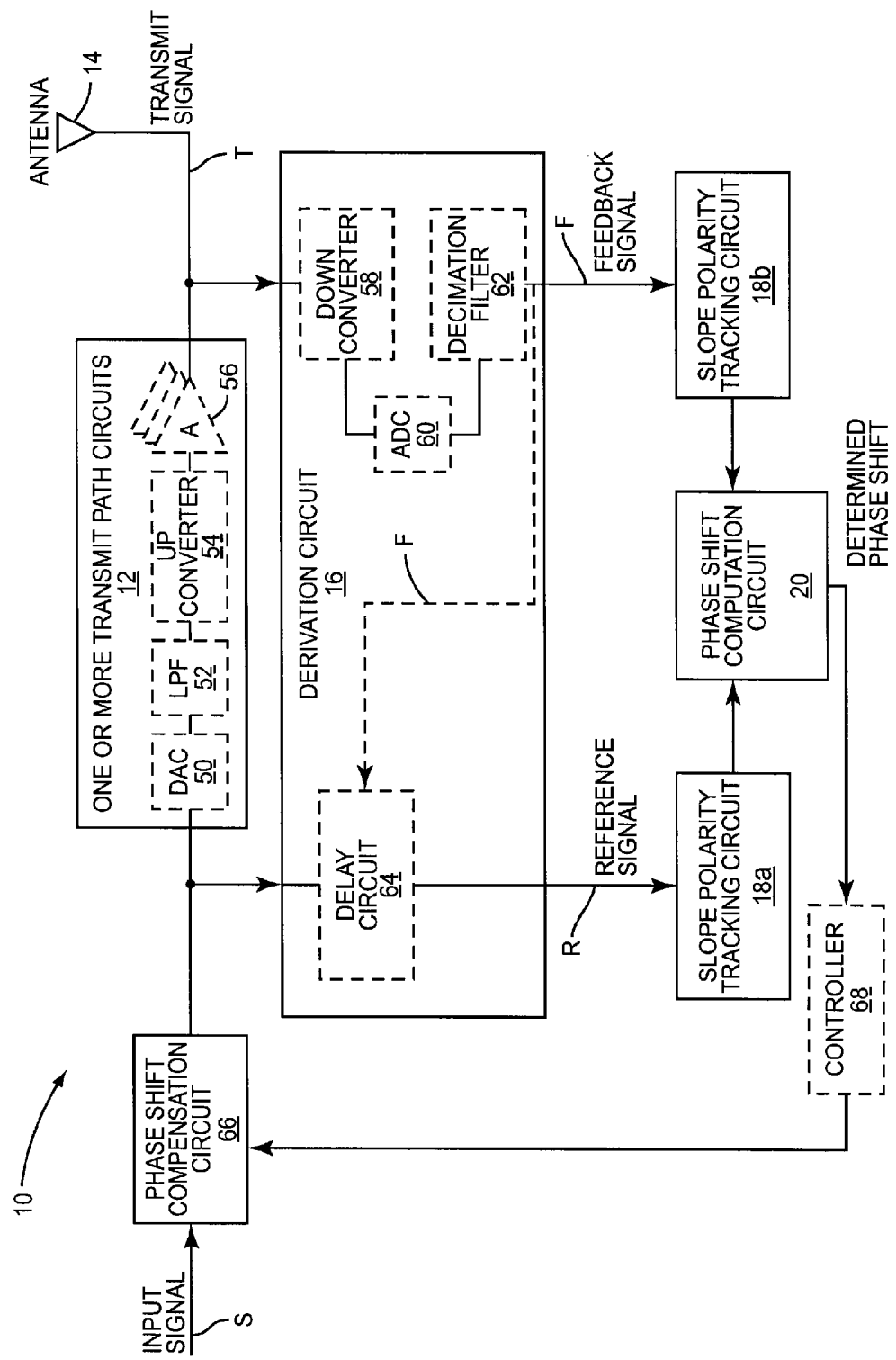
FIG. 6 is a block diagram illustrating one embodiment of the one or more transmit path circuits and the derivation circuit, and also illustrates a wireless communication transmitter that further includes a phase shift compensation circuit.

Turning now to the implementation details of the derivation circuit 16, FIG. 6 illustrates these details according to one embodiment of the present invention. In FIG. 6, the derivation circuit 16 derives the reference and feedback signals R, F so as to limit their differences to those attributable to the phase shift introduced by one or more of the transmit path circuits 12. The circuits 12 in FIG. 6, for example, convert a baseband input signal S to a radio transmit signal T, and include a digital-to-analog converter (DAC) 50, a low pass filter (LPF) 52, a frequency up-converter 54, and an amplifier 56 (e.g., a power amplifier, PA, a variable gain amplifier, VGA, or both). In this case, the amplifier 56 may introduce a phase shift to the radio transmit signal T relative to the baseband input signal S, while the DAC 50, LPF 52, and up-converter 54 do not. Moreover, each of the DAC 50, LPF 52, up-converter 54, and amplifier 56 delays the radio transmit signal T in time, relative to the baseband input signal S.

To limit the difference between the reference and feedback signals R, F to those resulting from a phase shift introduced by the amplifier 56, the derivation circuit 16 includes a down converter 58, an analog-to-digital converter (ADC) 60, a decimation filter 62, and a delay circuit 64. The down converter 58, ADC 60, and decimation filter 62 derive the feedback signal F as a baseband representation of the transmit signal T, thereby offsetting differences introduced by the DAC 50, LPF 52, and up-converter 54. Similarly, the delay circuit 64 synchronizes the feedback signal F in time with the reference signal R. That is, the delay circuit 64 offsets differences introduced by the time the transmit path circuits 12 take to convert the input signal S to the transmit signal T, plus the time the derivation circuit 16 takes to derive the feedback signal F from the reference signal R. So derived, differences in the reference and feedback signals R, F are attributable to those resulting from the amplifier 56.

Having determined the phase shift introduced based on these differences, the transmitter 10 of FIG. 6 further includes a phase shift compensation circuit 66 to offset the effect of such an unwanted phase shift. To do so, the phase shift compensation circuit 66 adjusts the phase of the input signal S by the determined magnitude, but in the opposite direction, of the transmitter phase shift.

In one embodiment, the phase shift compensation circuit 66 dynamically adjusts the phase of the input signal S upon configuration changes in the one or more transmit path circuits 12. As depicted in FIG. 6, for example, the amplifier 56 may be configured to have one or more gain values depending on the bias or gain stage set for the amplifier 56. Each different gain value of the amplifier 56 introduces a different phase shift to the transmit signal T. The phase shift compensation circuit 66 dynamically compensates for these different phase shifts, however, by adjusting the phase of the input signal S upon changes in gain value of the amplifier 56.

Further illustrated in FIG. 6, the phase shift compensation circuit 66 optionally adjusts the phase of the input signal S in coordination with a controller circuit 68. The controller circuit 68 maintains the state of the transmitter, such as the number of samples taken during a given determination interval, the timing required for the transmitter, and other process control information.

Moreover, as depicted in FIG. 6, the phase shift compensation circuit 66 adjusts the input signal S before the signal S is used for deriving the reference signal R. Those skilled in the art will appreciate, of course, that the phase shift compensation circuit 38 may alternatively adjust the actual generation of the input signal S, so that it is generated with the appropriate phase compensation. As another alternative, the phase shift compensation circuit 38 may instead adjust the input signal S after the signal S is used for such derivation.

Those skilled in the art will further appreciate that the phase shift compensation circuit 66 receives any type of information sufficient to determine the requisite input signal adjustment, and is not limited to receiving the determined magnitude and direction of the phase shift.

Figure 7:
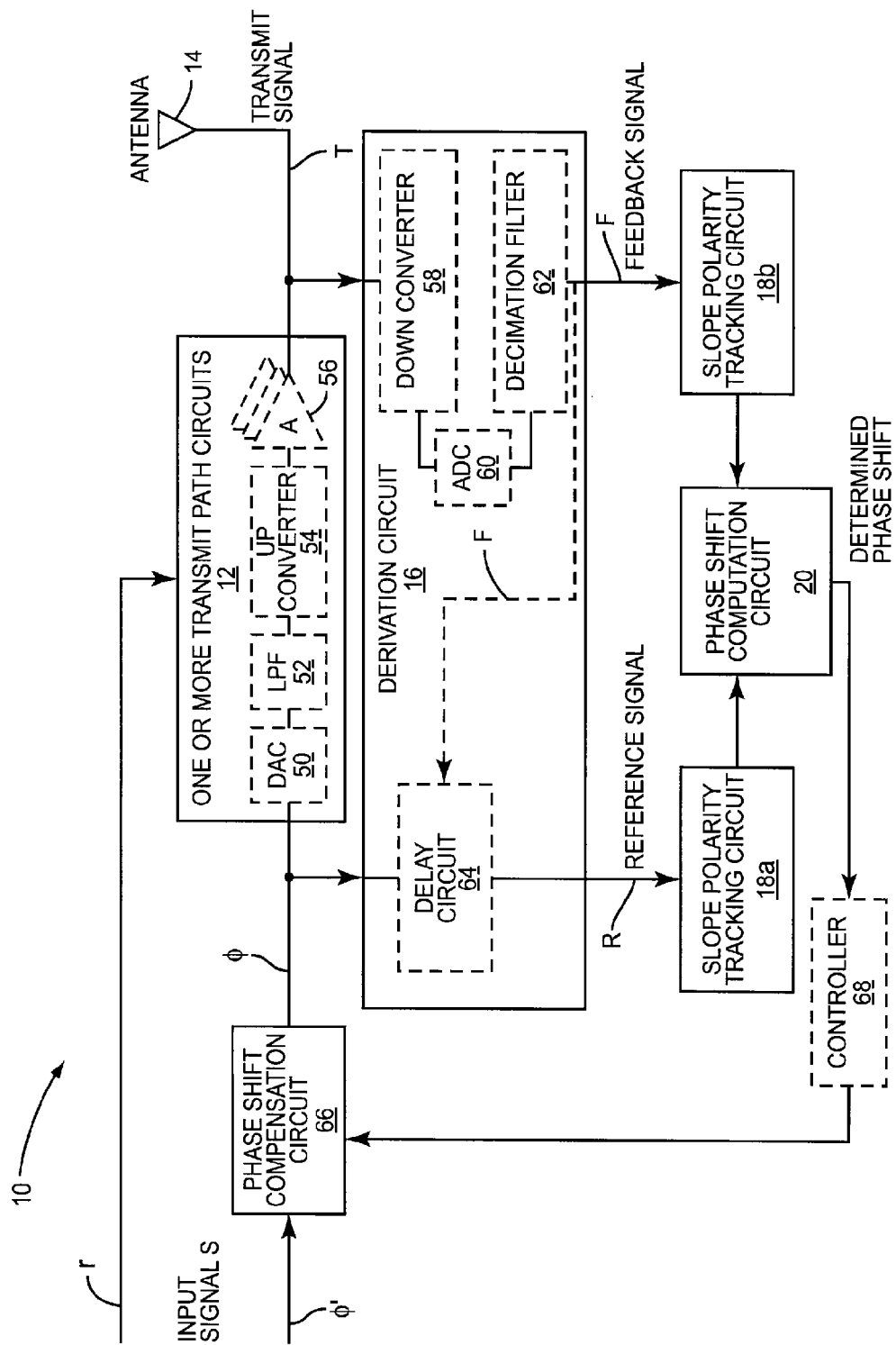
FIG. 7 is a block diagram illustrating an alternative embodiment of the wireless communication transmitter, the input signal being represented with polar components.

Furthermore, although certain embodiments herein refer to Cartesian components of the reference and feedback signals, the input signal S may be represented with either Cartesian components or polar components (e.g., magnitude and phase components). See, for example, FIG. 7 which shows the input signal S represented with magnitude r and phase φ components. When represented with polar components, however, the transmitter 10 in at least one embodiment converts the input signal S into its Cartesian components to calculate the direction of the transmitter phase shift as described above.

Still further, the wireless communication transmitter 10 may be a transmitter for any kind of equipment in a wireless communication system (e.g., a mobile station or a base station) and may communicate based on any applicable wireless communication standard.

Thus, it should be understood that the foregoing description and the accompanying drawings represent non-limiting examples of the methods and individual apparatuses taught herein. As such, the present invention is not limited by the foregoing description and accompanying drawings. Instead, the present invention is limited only by the following claims and their legal equivalents.

What is claimed is:

1. A method in a wireless communication transmitter of determining transmitter phase shift, comprising:
   deriving a reference signal from an input signal of the transmitter and a feedback signal from a corresponding transmit signal output by the transmitter;
   tracking the slope polarities of the reference signal and the feedback signal; and
   computing the transmitter phase shift as a function of differences in the tracked slope polarities.

2. The method of claim 1 wherein tracking the slope polarities of the reference signal and the feedback signal comprises evaluating the difference between successive samples of the reference signal and the difference between successive samples of the feedback signal, respectively.

3. The method of claim 1 wherein tracking the slope polarities of the reference and feedback signals comprises tracking a given number of slope polarities for each of the reference and feedback signals, and wherein computing the transmitter phase shift comprises calculating the magnitude of the phase shift based on a percentage of slope polarities out of the given number of slope polarities at which the slope polarities of the reference and feedback signals coincide.

4. The method of claim 1 further comprising:
shifting the phase of the reference signal by each one of a plurality of test angles;
tracking the slope polarity of the reference signal for each test angle; and
determining the magnitude and direction of the transmitter phase shift as that of the test angle resulting in the least difference between the tracked slope polarity of the reference signal and the tracked slope polarity of the feedback signal.

5. The method of claim 4 further comprising selecting the plurality of test angles from a range of candidate angles.

6. The method of claim 1 wherein the reference signal and the feedback signal are each a complex signal having a number of Cartesian components, and wherein tracking the slope polarities of the reference signal and the feedback signal comprises tracking the slope polarities of the same Cartesian component of the reference signal and the feedback signal.

7. The method of claim 1:
wherein the reference signal and the feedback signal are each a complex signal having first and second Cartesian components;
wherein tracking the slope polarities of the reference signal and the feedback signal comprises tracking the slope polarities of each signal's first and second Cartesian components; and
wherein computing the transmitter phase shift comprises computing a phase shift in each of multiple determination intervals, the computation being based in each interval on both differences in the tracked slope polarities of the first Cartesian components and differences in the tracked slope polarities of the second Cartesian components, or, alternatively, the computation being based in some intervals on only differences in the tracked slope polarities of the first Cartesian components and in other intervals on only differences in the tracked slope polarities of the second Cartesian components.

8. The method of claim 1:
wherein the reference signal and the feedback signal are each a complex signal having first and second Cartesian components;
wherein tracking the slope polarities of the reference signal and the feedback signal comprises tracking the slope polarity of each signal's first or second Cartesian component, and, respectively, tracking the slope polarity of the feedback signal's second or first Cartesian component;
further comprising detecting rising or falling edges of the slope polarity of each signal's first or second Cartesian component by comparing the tracked slope polarities of the signals' first or second Cartesian component; and
further comprising determining the direction of the transmitter phase shift as a function of the tracked slope polarity of the feedback signal's second or first Cartesian component evaluated at the rising or falling edges of the slope polarity of each signal's first or second Cartesian component.

9. The method of claim 1:
wherein the reference signal and the feedback signal are each a complex signal having first and second Cartesian components;
wherein tracking the slope polarities of the reference signal and the feedback signal comprises tracking the slope polarity of each signal's first or second Cartesian component, and, respectively, tracking the slope polarity of the reference signal's second or first Cartesian component;
further comprising detecting rising or falling edges of the slope polarity of each signal's first or second Cartesian component by comparing the tracked slope polarities of the signals' first or second Cartesian component; and
further comprising determining the direction of the transmitter phase shift as a function of the tracked slope polarity of the reference signal's second or first Cartesian component evaluated at the rising or falling edges of the slope polarity of each signals' first or second Cartesian component.

10. The method of claim 1 wherein the input signal is a baseband signal and the corresponding transmit signal is a radio signal, and wherein deriving the reference signal from the input signal and the feedback signal from the corresponding transmit signal comprises synchronizing the reference signal with a baseband representation of a transmit signal that corresponds to the input signal.

11. The method of claim 1 further comprising compensating for the transmitter phase shift by adjusting the phase of the input signal.

12. The method of claim 11 wherein compensating for the transmitter phase shift comprises dynamically compensating for the transmitter phase shift upon changes in the configuration of the transmitter.

13. The method of claim 1 wherein the input signal is represented with either Cartesian components or polar components.

14. A wireless communication transmitter configured to determine transmitter phase shift comprising:
one or more transmit path circuits configured to convert an input signal of the transmitter into a corresponding transmit signal for transmission by an antenna;
a derivation circuit configured to derive a reference signal from the input signal and a feedback signal from the corresponding transmit signal;
one or more slope polarity tracking circuits configured to track the slope polarities of the reference signal and the feedback signal; and
a phase shift computation circuit configured to compute the transmitter phase shift as a function of differences in the tracked slope polarities.

15. The wireless communication transmitter of claim 14 wherein the one or more slope polarity tracking circuits are configured to track the slope polarities of the reference signal and the feedback signal by evaluating the difference between successive samples of the reference signal and the difference between successive samples of the feedback signal, respectively.

16. The wireless communication transmitter of claim 14 wherein the one or more slope polarity tracking circuits are configured to track a given number of slope polarities for each of the reference and feedback signals, and wherein the phase shift computation circuit is configured to compute the transmitter phase shift by calculating the magnitude of the phase shift based on a percentage of slope polarities out of the given number of slope polarities at which the slope polarities of the reference and feedback signals coincide.

17. The wireless communication transmitter of claim 14:
further comprising a reference signal rotation circuit configured to rotate the phase of the reference signal by each one of a plurality of test angles;
wherein the one or more slope polarity tracking circuits are further configured to track the slope polarity of the reference signal for each test angle; and wherein the phase shift computation circuit is configured to determine the magnitude and direction of the transmitter phase shift as that of the test angle resulting in the least difference between the tracked slope polarity of the reference signal and the tracked slope polarity of the feedback signal.

18. The wireless communication transmitter of claim 17 wherein the phase shift computation circuit is further configured to select the plurality of test angles from a range of candidate angles.

19. The wireless communication transmitter of claim 14 wherein the reference signal and the feedback signal are each a complex signal having a number of Cartesian components, and wherein the one or more slope polarity tracking circuits are configured to track the slope polarities of the reference signal and the feedback signal by tracking the slope polarities of the same Cartesian component of the reference signal and the feedback signal.

20. The wireless communication transmitter of claim 14:
  wherein the reference signal and the feedback signal are each a complex signal having first and second Cartesian components;
  wherein the one or more slope polarity tracking circuits are configured to track the slope polarities of the reference signal and the feedback signal by tracking the slope polarities of each signal's first and second Cartesian components; and
  wherein the phase shift computation circuit is configured to compute the transmitter phase shift by computing a phase shift in each of multiple determination intervals, the computation being based in each interval on both differences in the tracked slope polarities of the first Cartesian components and differences in the tracked slope polarities of the second Cartesian components, or, alternatively, the computation being based in some intervals on only differences in the tracked slope polarities of the first Cartesian components and in other intervals on only differences in the tracked slope polarities of the second Cartesian components.

21. The wireless communication transmitter of claim 14:
  wherein the reference signal and the feedback signal are each a complex signal having first and second Cartesian components;
  wherein the one or more slope polarity tracking circuits are configured to track the slope polarities of the reference signal and the feedback signal by tracking the slope polarity of each signal's first or second Cartesian component, and, respectively, tracking the slope polarity of feedback signal's second or first Cartesian component; and
  wherein the phase shift computation circuit is configured to compute the transmitter phase shift by:
    detecting rising or falling edges of the slope polarity of each signal's first or second Cartesian component by comparing the tracked slope polarities of the signals' first or second Cartesian component; and
    determining the direction of the transmitter phase shift as a function of the tracked slope polarity of the feedback signal's second or first Cartesian component evaluated at the rising or falling edges of the slope polarity of each signal's first or second Cartesian component.

22. The wireless communication transmitter of claim 14:
  wherein the reference signal and the feedback signal are each a complex signal having first and second Cartesian components;
  wherein the one or more slope polarity tracking circuits are configured to track the slope polarities of the reference signal and the feedback signal by tracking the slope polarity of each signal's first or second Cartesian component, and, respectively, tracking the slope polarity of the reference signal's second or first Cartesian component; and
  wherein the phase shift computation circuit is configured to compute the transmitter phase shift by:
    detecting rising or falling edges of the slope polarity of each signal's first or second Cartesian component by comparing the tracked slope polarities of the signals' first or second Cartesian component; and
    determining the direction of the transmitter phase shift as a function of the tracked slope polarity of the reference signal's second or first Cartesian component evaluated at the rising or falling edges of the slope polarity of each signal's first or second Cartesian component.

23. The wireless communication transmitter of claim 14:
  wherein the input signal is a baseband signal and the corresponding transmit signal is a radio signal; and
  wherein the derivation circuit is configured to derive the reference signal from the input signal and the feedback signal from the corresponding transmit signal by synchronizing the reference signal with a baseband representation of a transmit signal that corresponds to the input signal.

24. The wireless communication transmitter of claim 14 further comprising a phase shift compensation circuit configured to compensate for the transmitter phase shift by adjusting the phase of the input signal.

25. The wireless communication transmitter of claim 24 wherein the phase shift compensation circuit is further configured to dynamically compensate for the transmitter phase shift upon changes in the configuration of one or more of the transmit path circuits.

26. The wireless communication transmitter of claim 14 wherein the input signal is represented with either Cartesian components or polar components.

* * * * *